(12) United States Patent
Liu et al.

(10) Patent No.: US 7,790,577 B2
(45) Date of Patent: Sep. 7, 2010

(54) CRACKSTOP STRUCTURES AND METHODS OF MAKING SAME

(75) Inventors: Xiao Hu Liu, Briarcliff Manor, NY (US); Chih-Chao Yang, Glenmont, NY (US); Haining Sam Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 12/175,006

(22) Filed: Jul. 17, 2008

(65) Prior Publication Data

US 2010/0012950 A1 Jan. 21, 2010

(51) Int. Cl.
  *H01L 21/00* (2006.01)
(52) U.S. Cl. ...................... 438/462; 438/460
(58) Field of Classification Search .......... 438/460–465
  See application file for complete search history.

(56) References Cited

U.S. PATENT DOCUMENTS

| | | | |
|---|---|---|---|
| 2006/0223242 A1* | 10/2006 | Daubenspeck et al. | 438/132 |
| 2007/0194409 A1 | 8/2007 | Wang et al. | |
| 2007/0205481 A1 | 9/2007 | Ishida | |
| 2007/0264035 A1 | 11/2007 | Fushimi et al. | |
| 2008/0064189 A1* | 3/2008 | Daubenspeck et al. | 438/465 |
| 2009/0065952 A1* | 3/2009 | Su et al. | 257/778 |
| 2009/0203192 A1* | 8/2009 | Kaltalioglu et al. | 438/462 |
| 2010/0038733 A1* | 2/2010 | Minervini | 257/416 |

* cited by examiner

*Primary Examiner*—Richard A. Booth
(74) *Attorney, Agent, or Firm*—Schmeiser, Olsen & Watts; Ian D. MacKinnon

(57) ABSTRACT

An integrated circuit chip and a method of fabricating an integrated circuit chip. The integrated circuit chip includes: a set of wiring levels stacked from a first wiring level to a last wiring level; and a respective void in each wiring level of two or more wiring levels of the set wiring levels, each respective void extending in a continuous ring parallel and proximate to a perimeter of the integrated circuit chip, a void of a higher wiring level stacked directly over but not contacting a void of a lower wiring level, the respective voids forming a crack stop.

10 Claims, 6 Drawing Sheets

CRACKSTOP STRUCTURES AND METHODS OF MAKING SAME

FIELD OF THE INVENTION

The present invention relates to the field of semiconductor devices; more specifically, it relates to crackstops and methods of making crackstops.

BACKGROUND OF THE INVENTION

Crackstops are structures fabricated along the perimeter of integrated circuit chips to prevent delamination of the various layers of the integrated circuit chip and other edge damage during singulation (otherwise known as dicing) of individual integrated circuit chips from a wafer on which multiple integrated circuit chips have been fabricated. The inventors have determined the protection provided by conventional crackstops has become less adequate as the dimensions of integrated circuit features has decreased and with the increasing use of low dielectric insulating materials.

SUMMARY OF THE INVENTION

A first aspect of an embodiment of the invention is a method, comprising: (a) for one or more integrated circuit chips of an array of integrated circuit chips on a semiconductor substrate, forming a first or next wiring level over the substrate; (b) for predetermined first or next wiring levels of each integrated circuit chip of the one or more integrated circuit chips, forming a corresponding first or next void in the first or next wiring level, the first or next void extending in a continuous ring parallel and proximate to a perimeter of the integrated circuit chip, a void of a subsequently formed wiring level stacked directly over but not contacting a void of a previously formed level; (c) repeating steps (a) and (b) multiple times to form in each integrated circuit chip of the one or more integrated circuit chips a respective crack stop comprising a stack of voids; and after (c), (d) dicing the array of integrated circuit chips into individual integrated circuit chips, each individual integrated circuit chip of the one or more integrated circuit chips including a respective crackstop.

A second aspect of an embodiment of the invention is an integrated circuit chip, comprising: a set of wiring levels stacked from a first wiring level to a last wiring level; and a respective void in each wiring level of two or more wiring levels of the set wiring levels, each respective void extending in a continuous ring parallel and proximate to a perimeter of the integrated circuit chip, a void of a higher wiring level stacked directly over but not contacting a void of a lower wiring level, the respective voids forming a crack stop.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
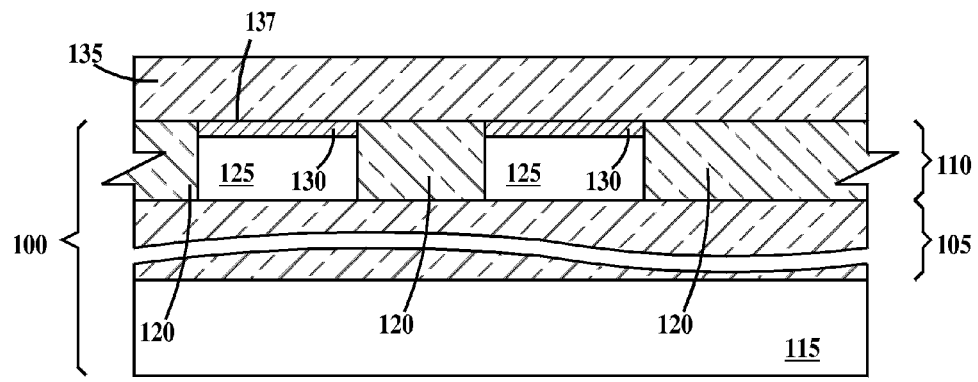
FIGS. 1A through 1I are cross-sections illustrating fabrication of a crackstop structure according to embodiments of the present invention.

FIGS. 1A through 1I are cross-sections illustrating fabrication of a crackstop structure according to embodiments of the present invention. In FIG. 1A, semiconductor substrate 100 includes a buried oxide (BOX) layer 105 between a semiconductor layer 110 and a supporting substrate 115. In one example, semiconductor layer 110 and supporting substrate 115 comprise silicon. As illustrated, semiconductor substrate 100 is an example of a silicon-on-insulator (SOI) substrate. Other semiconductor substrates, such as bulk silicon substrates and silicon-germanium substrates may be substituted for SOI substrates. Regions of shallow trench isolation (STI) 120 have been formed in silicon layer 100 simultaneously forming silicon islands 125 which are completely surrounded along their perimeters by STI 120. A contact layer 130 is formed in a region of silicon island 125 adjacent to top surfaces of the silicon islands. Formed on top surfaces 137 of contact layers 130 and on the top surface of STI 120 is a first dielectric layer 135. In one example first dielectric layer 135 is silicon nitride. In one example first dielectric layer 135 is silicon nitride under internal tensile stress (e.g. about 1.5 GPa). In one example, first dielectric layer 135 is between about 50 nm and about 150 nm thick. In one example, contact layer 130 is a metal silicide.

Figure 1B:
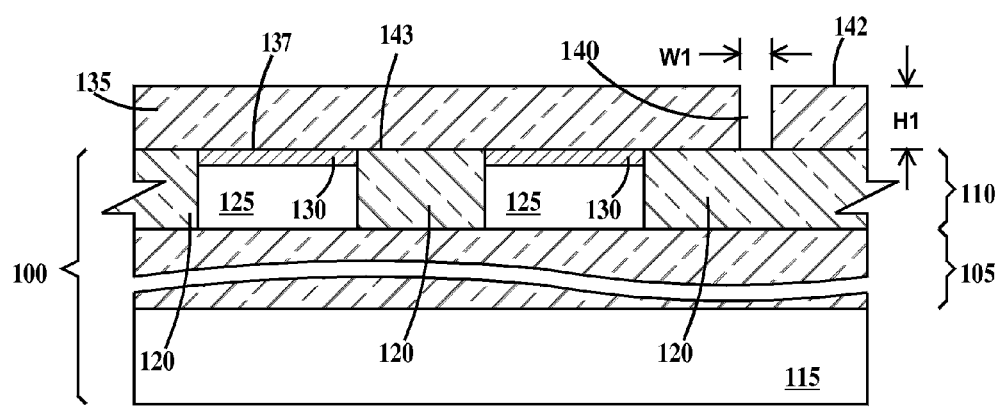

In FIG. 1B, a trench 140 has been formed in first dielectric layer 135 over STI 120. Trench 140 extends from a top surface 142 of first dielectric layer 135 to a top surface 143 of STI 120. Trench 140 has a width W1 and a height H1 (where H1 is equal to the thickness of first dielectric layer 135. Alternatively, a thin layer (less than about 20% of the thickness of first dielectric layer 135) may be left in the bottom of trench 140. In one example, the aspect ratio (H1/W1) of trench 140 is equal to or greater than about 2. In one example, the aspect ratio (H1/W1) of trench 140 is equal to or greater than about 3. In one example, trench 140 may be formed by applying a layer of photoresist to first dielectric layer 135, exposing the photoresist to actinic radiation through a patterned photomask, developing the exposed photoresist, reactive ion etching (RIE) first dielectric layer 135 where it its not protected by the photoresist layer and then removing the photoresist layer.

Figure 1C:
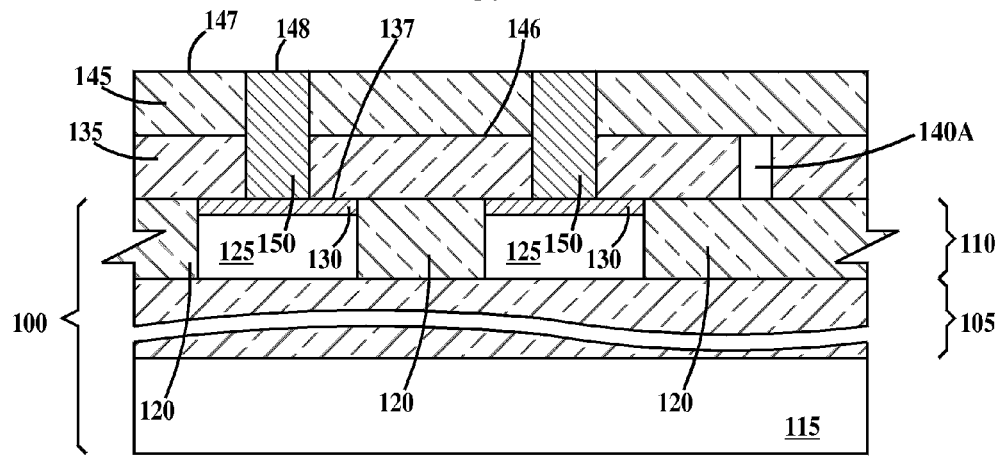

FIG. 1C, a second dielectric layer 145 is formed on a top surface 146 of first dielectric layer 135. Because of the high aspect ratio of trench 140 (see FIG. 1B), second dielectric layer 145 does not fill or only partially fills trench 140 (see FIG. 1B) forming a void 140A in first dielectric layer 135. See discussion infra and FIG. 2. Contacts 150 are formed through first and second dielectric layers 135 and 145. Contacts 150 extend from a top surface 147 of second dielectric layer to top surface 137 of contact layer 130. Top surfaces 148 of contacts 150 are essentially coplanar with top surface 147 of second dielectric layer 145. In one example second dielectric layer 145 comprises a high density plasma (HDP) oxide. An HDP oxide is an oxide formed in a high-density plasma chemical vapor (CVD) deposition process and is well know in the industry. In one example, HDP oxide is formed from mixture of oxygen and silane at a pressure of about 2 mTorr to about 10 mTorr in a plasma having an electron density of about 1E12/cm$^2$. In one example second dielectric layer 145 is between about 200 nm and about 300 nm thick. First dielectric layer 135, second dielectric layer 145 and contacts 150 comprise a contact level of an integrated circuit chip, which may also be considered a wiring level. Contacts 150 and void 140A extend in concentric rings proximate to a perimeter of the integrated circuit chip.

Figure 1D:
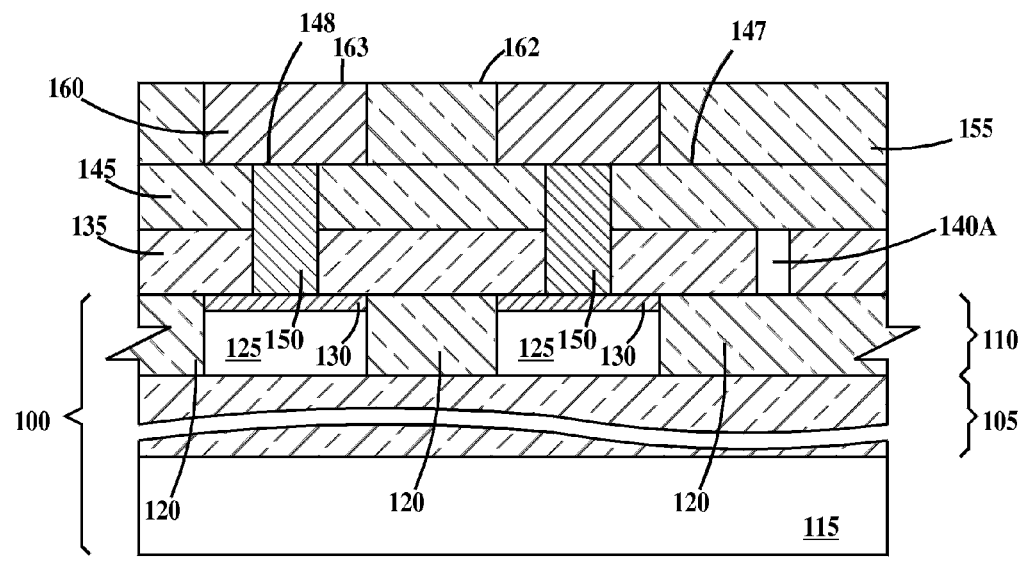

In FIG. 1D, a third dielectric layer 155 is formed on top surface 147 of second dielectric layer 145. Metal wires 160 are formed through third dielectric layer 155. Wires 160 extend from a top surface 162 of third dielectric layer 155 to top surfaces 148 of contacts 150. Top surfaces 163 of wires 160 are essentially coplanar with top surface 162 of third dielectric layer 155. In one example, third dielectric layer 155 comprises one or more low K (dielectric constant) materials, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. A low K dielectric material has a relative permittivity of about 2.4 or less. In one example, third dielectric layer 155 is between about 100 nm and about 200 nm thick. Third dielectric layer 155 and wires 160 comprise a first wiring level (or a second wiring level if contacts 150 are counted as wires) of the integrated circuit chip. Wires 160 extend in concentric rings proximate to a perimeter of the integrated circuit chip.

Figure 1E:
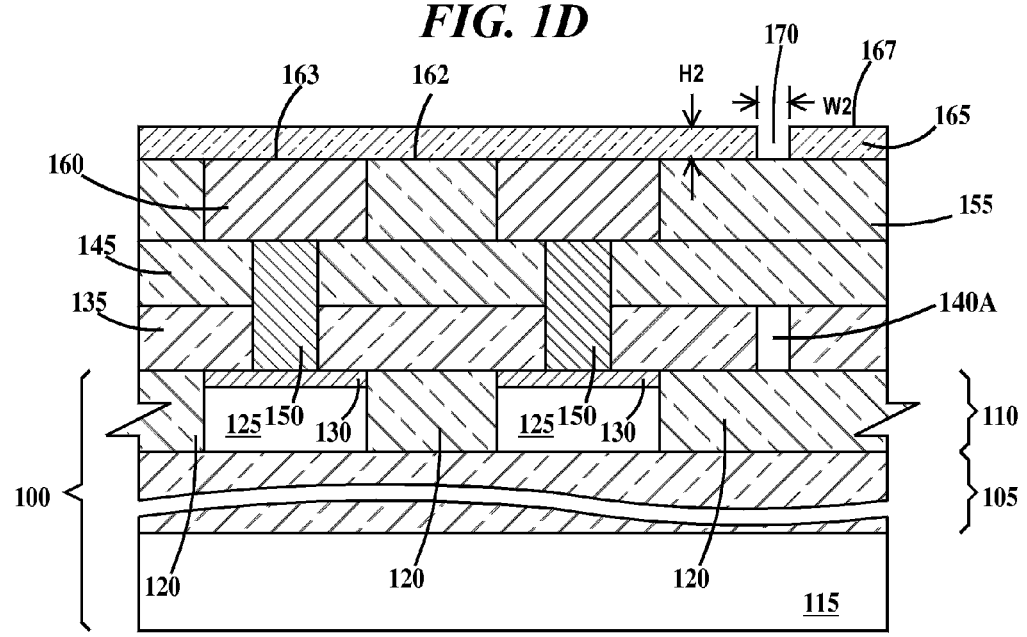

In FIG. 1E, a fourth dielectric layer 165 is formed on top surface 162 of third dielectric layer 155 and on top surfaces 163 of wires 160. A trench 170 has been formed in fourth dielectric layer 165 aligned over void 140A and over STI 120. Trench 170 extends from top surface 167 of fourth dielectric layer 165 to top surface 162 of third dielectric layer 155. Trench 170 has a width W2 and a height H2 (where W2 is equal to the thickness H2 of fourth dielectric layer 165. Alternatively, a thin layer (less than about 20% of the thickness of fourth dielectric layer 165) may be left in the bottom of trench 170. In one example, the aspect ratio (H2/W2) of trench 170 is equal to or greater than about 2. In one example, the aspect ratio (H2/W2) of trench 170 is equal to or greater than about 3. In one example, fourth dielectric layer 165 comprises silicon nitride or silicon carbide. In one example, fourth dielectric layer 165 is between about 25 and 75 nm thick. In one example, trench 170 may be formed by applying a layer of photoresist to fourth dielectric layer 165, exposing the photoresist to actinic radiation through a patterned photomask, developing the exposed photoresist, RIE fourth dielectric layer 165 where it its not protected by the photoresist layer and then removing the photoresist layer.

Figure 1F:
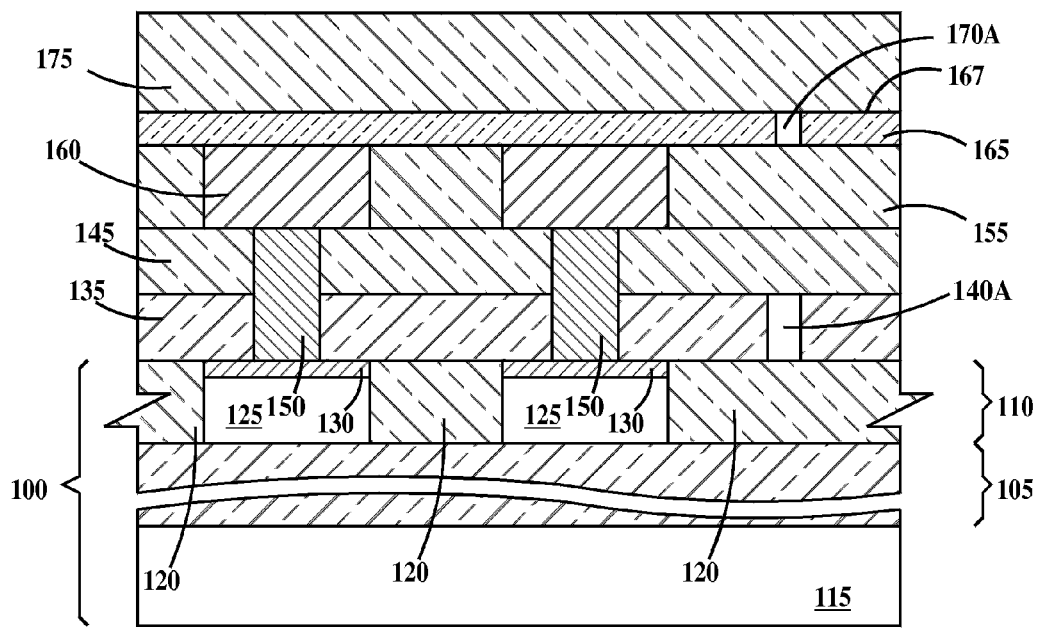

In FIG. 1F, a fifth dielectric layer 175 is formed on top surface 167 of fourth dielectric layer 165. Because of the high aspect ratio of trench 170 (see FIG. 1E), fifth dielectric layer 175 does not fill or only partially fills trench 170 (see FIG. 1E) forming a void 170A in fourth dielectric layer 165. See discussion infra and FIG. 2. In one example, fifth dielectric layer 175 comprises one or more of the low K dielectric materials listed supra. In one example, fifth dielectric layer 175 is between about 300 nm to about 400 nm thick.

Figure 1G:
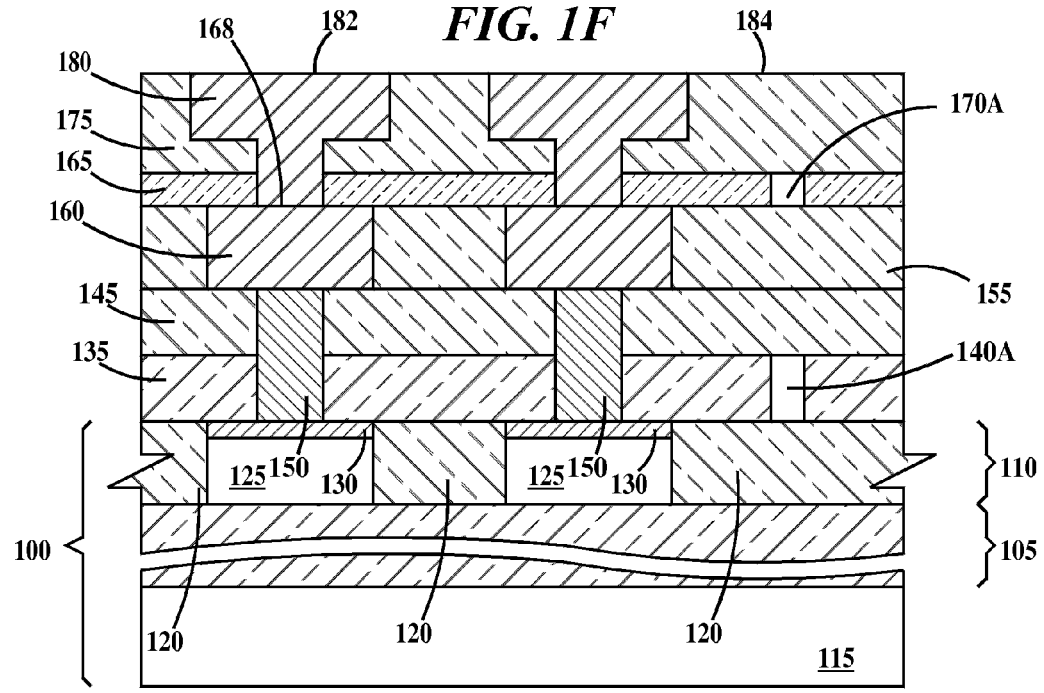

In FIG. 1G, metal wires 180 are formed through fourth dielectric layer 175 and fifth dielectric layer 165. Wires 180 extend from a top surface 184 of fifth dielectric layer 175 to top surfaces 168 of wires 160. Top surfaces 182 of wires 180 are essentially coplanar with a top surface 184 of fifth dielectric layer 175. Fifth dielectric layer 165, sixth dielectric layer 175 and wires 180 comprise a second wiring level (or a third wiring level if contacts 150 are counted as wires) of the integrated circuit chip. Wires 180 extend in concentric rings proximate to a perimeter of the integrated circuit chip.

Figure 1H:
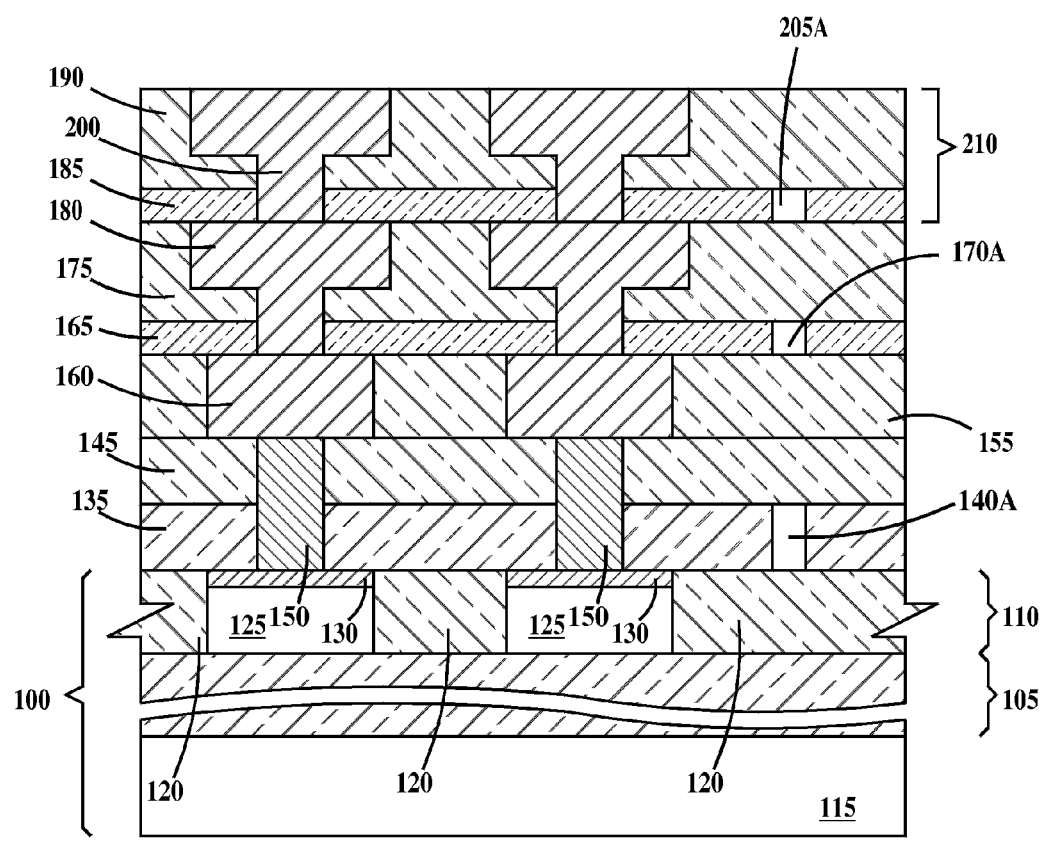

In FIG. 1H, a sixth dielectric layer 185 is formed on fifth dielectric layer 175, a seventh dielectric layer 190 is formed on the sixth dielectric layer, wires 200 are formed through the sixth and seventh dielectric layers to wires 180 and a void 205A is formed in the sixth dielectric layer aligned over voids 170A and 140A and STI 120. Void 205A is similarly formed as voids 140A and 170A by control of the aspect ration of a precursor trench formed in sixth dielectric layer 185. In one example, sixth dielectric layer 185 comprises silicon nitride or silicon carbide. In one example, sixth dielectric layer 185 is between about 25 and 75 nm thick. In one example, seventh dielectric layer 190 comprises one or more of the low K dielectric materials listed supra. In one example, seventh dielectric layer 190 is between about 300 nm to about 400 nm thick.

Sixth dielectric layer 185, seventh dielectric layer 190 and wires 200 comprise a third (or a fourth wiring level if contacts 150 are counted as wires) and in this example, last wiring level of the integrated circuit chip. Wires 200 and void 205A extend in rings proximate to a perimeter of the integrated circuit chip. Additional wiring levels (not illustrated in the drawings) similar to the second and third wiring levels may be formed between the first and second wiring levels.

Figure 1I:
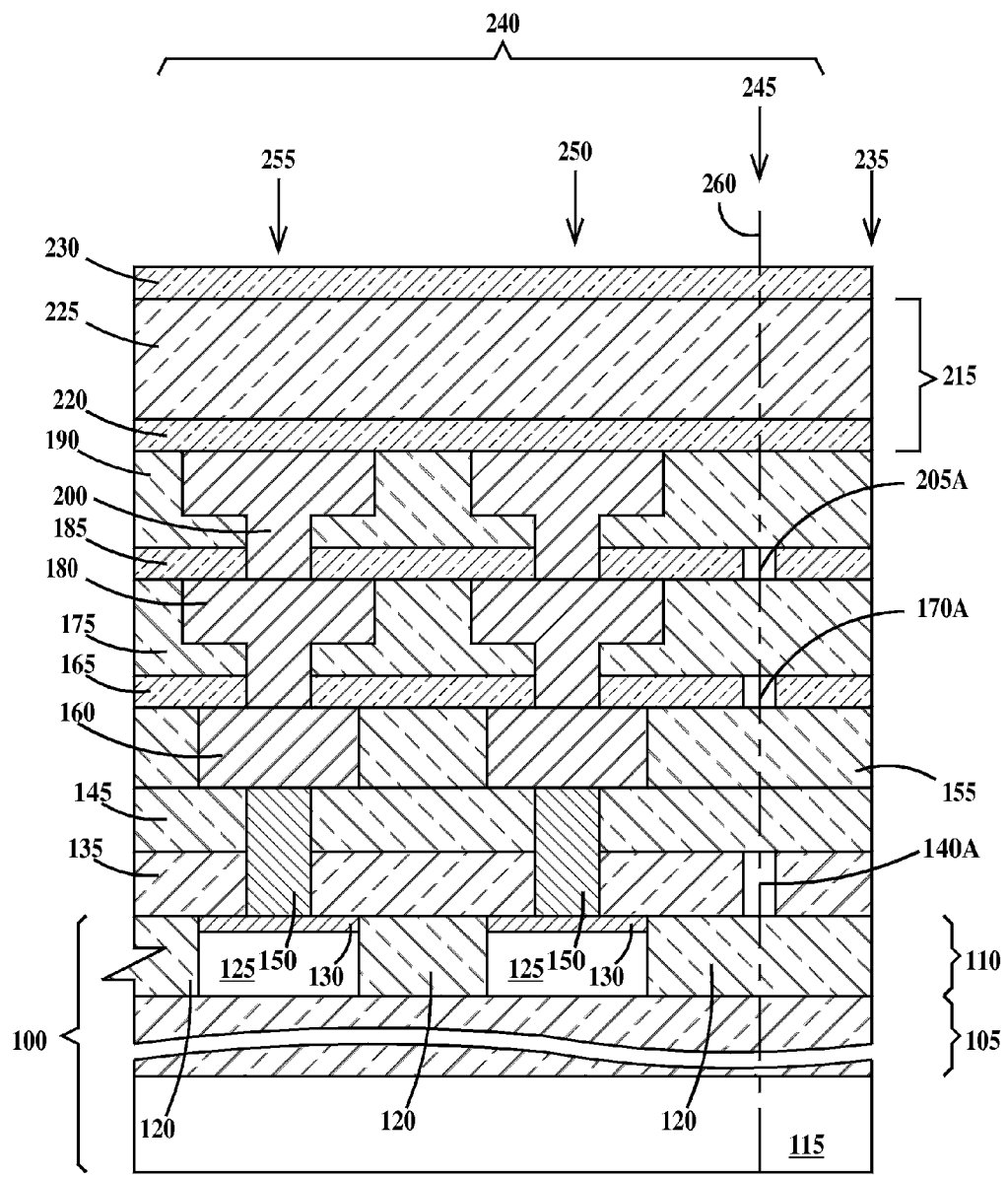

In FIG. 1I, a terminal passivation level 215 is formed on seventh dielectric layer 190. Terminal passivation level 215 comprise a first terminal dielectric layer 220 and a second terminal dielectric layer 225 Terminal pads (not shown) are formed in terminal passivation level 215 to the left of wires 200, 180, 160 and contacts 150. In one example, first terminal dielectric layer 220 comprises silicon nitride or silicon carbide. In one example, first terminal dielectric layer 220 is between about 25 and 75 thick. In one example second terminal dielectric layer 225 comprises an N-doped silicon glass. A chip passivation layer 230 is formed on terminal level 215. The terminal pads (not shown) are not covered by chip passivation layer 230. Chip passivation layer 230 may comprise two or more layers. Chip passivation layer 230 may include an oxide layer, a silicon carbide layer, a polyimide layer and combination thereof.

Also in FIG. 1I, an edge 235 of a singulated chip has been formed by dicing. In one example, dicing is performed by sawing the wafer into individual chips. A peripheral region 240 of the singulated integrated circuit chip includes a crackstop 245, an outer guard ring 250 and an inner guard ring 255. Crackstop 245 includes voids 140A, 170A and 190A aligned in a common plane 260 parallel to edge 235. Voids 205A, 170A and 140A are stacked (i.e., aligned) directly over each other but do not contact each other, there being a dielectric layer intervening between each of the voids. Edge 235 is perpendicular to a top surface of substrate 100. Each of guard rings 250 and 255 includes a silicon island 125, a contact layer 130, a contact 150, a wire 160, a wire 180 and a wire 200. Since integrated circuit chips generally have a square or rectangular footprint, there is a plane 260 for each of the four edges of the integrated circuit chip.

Contacts 150 and wires 160 are single damascene contacts and wires formed by a single-damascene process. Wires 180 and 200 are dual-damascene wires formed by a dual damascene process. In one example, contacts 150 comprise tungsten. In one example, wires 160, 180 and 200 comprise a core of copper, a liner of tantalum over the copper core and a liner of tantalum nitride over the tantalum liner. The liners are formed on the sides and bottom of the trench the wire in as described infra.

A damascene process is one in which wire trenches or via openings are formed in a dielectric layer, an electrical conductor of sufficient thickness to fill the trenches is deposited on a top surface of the dielectric layer, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

In one example, not all wiring levels need to contain voids. In the present example of FIGS. 1A through 1H, the wiring level comprising wires 160 and third dielectric layer 155 does not contain crackstop voids. Likewise either of crackstop voids 140A or 170A need not be formed. However the more levels having crackstop voids, the more effective crackstop 245 will be at preventing delamination and propagation of damage from edge 235 into the interior of the integrated circuit chip. By incorporating an additional dielectric layer between second dielectric layer 135 and third dielectric layer 155, a crackstop void may be formed in this additional dielectric layer using the high aspect ratio trench technique described supra, so the wiring level comprising wires 160, and third dielectric layer 155 may contain a crackstop void and the additional dielectric layer may contain a crackstop void. The actual determination of whether or not a wiring level is to contain a crackstop void is determined during the design of the integrated circuit chip as part of the design dataset and incorporated as features of the photomasks used during fabrication of the integrated circuit chip.

Figure 2:
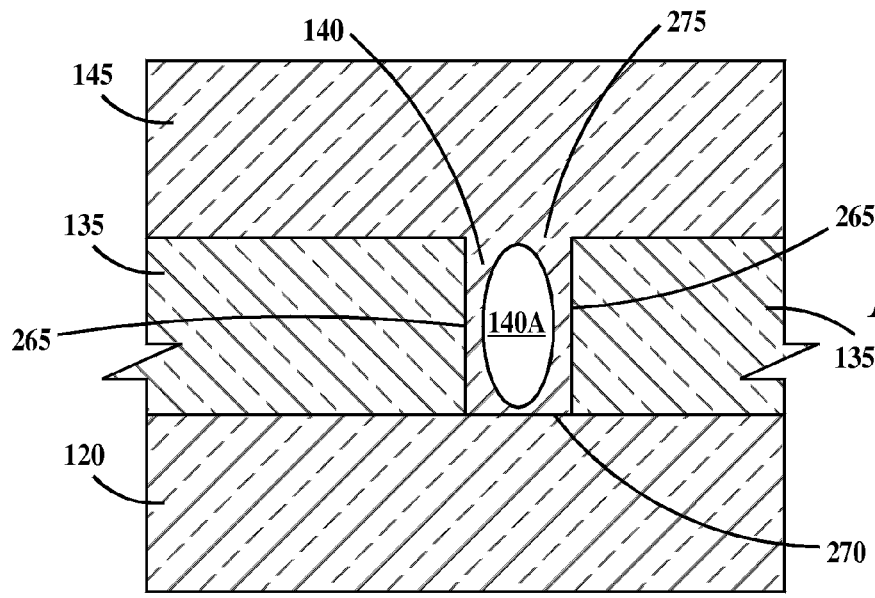
FIG. 2 is a detailed view of exemplary void formation in the crackstop structures of the embodiments of the present invention.

FIG. 2 is a detailed view of exemplary void formation in the crackstop structures of the embodiments of the present invention. In FIG. 2, it can be seen that the material of second dielectric layer 145 coats sidewalls 265 and bottom 270 of trench 140 but the trench is not completely filled in forming the void 140A. In other examples, bottom surface 270 may not be completely covered by the material of dielectric layer 145.

Figure 3:
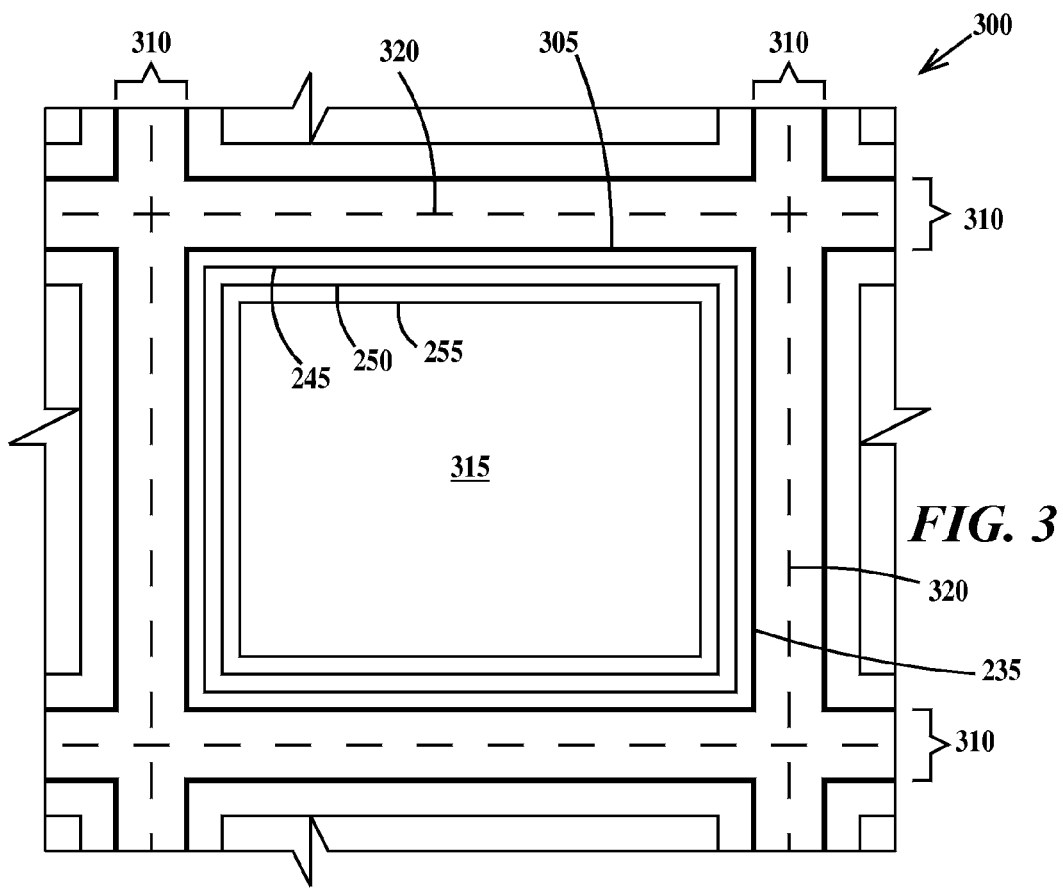
FIG. 3 is a plan view of integrated circuit chips prior to singulation according to embodiments of the present invention.

FIG. 3 is a plan view of integrated circuit chips prior to singulation according to embodiments of the present invention. In FIG. 3, a wafer 300 includes an array of un-singulated integrated circuit chips 305. Chips 305 are separated by kerf regions 310. An active region 315 of each integrated circuit chip is surrounded by crackstop 245 and outer and inner guard rings 250 and 255. The heavy line indicates edge 235 of chip 305 after dicing along the dashed lines 320.

Thus, the embodiments of the present invention provide a crackstop having small horizontal dimensions and suitable for use with low-K inter-level dielectric materials.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) for one or more integrated circuit chips of an array of integrated circuit chips on a semiconductor substrate, forming a first or next wiring level over said substrate;
   (b) for predetermined first or next wiring levels of each integrated circuit chip of said one or more integrated circuit chips, forming a corresponding first or next void in said first or next wiring level, said first or next void extending in a continuous ring parallel and proximate to a perimeter of said integrated circuit chip, a void of a subsequently formed wiring level stacked directly over but not contacting a void of a previously formed level;
   (c) repeating steps (a) and (b) multiple times to form in each integrated circuit chip of said one or more integrated circuit chips a respective crack stop comprising a stack of voids; and
   after (c), (d) dicing said array of integrated circuit chips into individual integrated circuit chips, each individual integrated circuit chip of said one or more integrated circuit chips including a respective crackstop.

2. The method of claim 1, wherein each void of each wiring level is formed by etching a respective trench in a respective first dielectric layer and depositing a respective second dielectric layer on said respective first dielectric layer and over said respective trench, said respective second dielectric layer not completely filling said respective trench.

3. The method of claim 2, wherein for at least one wiring level, said first dielectric layer comprises silicon nitride or silicon carbide and said second dielectric layer comprise a low K dielectric material having a permittivity of 2.4 or less.

4. The method of claim 2, wherein for at least one wiring level, said first dielectric layer comprises silicon nitride or silicon carbide and said second dielectric layer comprise high density plasma oxide.

5. The method of claim 1, wherein said first wiring level includes a first dielectric layer and a second dielectric layer and voids of said first wiring level are formed by etching a trench in said first dielectric layer and depositing said second dielectric layer on said first dielectric layer and over said trench, said second dielectric layer not completely filling said trench.

6. The method of claim 1, wherein respective second wiring levels of each integrated circuit chip of said array of integrated circuit chips do not include voids of respective crackstops.

7. The method of claim 1, wherein third and subsequent wiring levels include respective first and a second dielectric layers and respective voids of said subsequent wiring levels are formed by etching a trench in said respective first dielectric layers and depositing said respective second dielectric layers on said respective first dielectric layers and over said respective trenches, said respective second dielectric layers not completely filling said respective trenches.

8. The method of claim 1, further including:
   (b) including, for each integrated circuit chip of said one or more integrated circuit chips, forming a first or next metal wire in a dielectric layer of said first or next wiring level, said first or next wire extending in a continuous ring parallel and proximate to said perimeter of said integrated circuit chip, a wire of a subsequently formed wiring level stacked directly over and contacting a wire of a previously formed wiring level;

after (c), each integrated circuit chip of said one or more integrated circuit chips including a respective guard ring comprising a stack of wires; and after said dicing said array of integrated circuit chips into individual integrated circuit chips, each individual integrated circuit chip of said one or more integrated circuit chips including a respective guard ring, a respective guard ring and a respective crackstop, said respective crackstops intervening between said respective guard rings and respective perimeters of each individual integrated circuit chip of said one or more integrated circuit chips.

9. The method of claim 8, further including:

(b) including, for each integrated circuit chip of said one or more integrated circuit chips, forming a first or next additional metal wire in said dielectric layer of said first or next wiring level, said first or next additional wire extending in a continuous ring parallel and proximate to said perimeter of said integrated circuit chip of said one or more integrated circuit chips, an additional wire of a subsequently formed wiring level stacked directly over and contacting an additional wire of said previously formed level;

after (c), each integrated circuit chip of said one or more integrated circuit chips including a respective additional guard ring comprising a stack of additional wires; and after said dicing said array of integrated circuit chips into individual integrated circuit chips, each individual integrated circuit chip of said one or more integrated circuit chips including a respective additional guard ring, said guard ring intervening between said additional guard ring and said crackstop.

10. The method of claim 1, wherein said substrate is a silicon on insulator substrate comprising a silicon layer on a buried oxide layer; and further including before (a) forming a dielectric filled trench in said silicon layer, said dielectric filled trench extending from a top surface of said silicon layer to a top surface of said buried oxide layer, said respective crackstops formed directly over respective dielectric filled trenches of each integrated circuit chip of said array of integrated circuit chips.

* * * * *